United States Patent
Suzuki et al.

(10) Patent No.: US 8,360,556 B2
(45) Date of Patent: Jan. 29, 2013

(54) WIRING BOARD AND LIQUID JETTING HEAD

(75) Inventors: Yusuke Suzuki, Aichi-ken (JP); Atsushi Ito, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 42 days.

(21) Appl. No.: 13/040,889

(22) Filed: Mar. 4, 2011

(65) Prior Publication Data

US 2011/0240762 A1 Oct. 6, 2011

(30) Foreign Application Priority Data

Mar. 31, 2010 (JP) .................. 2010-080659

(51) Int. Cl.
*B41J 2/14* (2006.01)

(52) U.S. Cl. .............. 347/50; 347/59; 347/58; 347/57

(58) Field of Classification Search .............. 347/50, 347/59, 58, 57, 87
See application file for complete search history.

(56) References Cited

U.S. PATENT DOCUMENTS

| | | |
|---|---|---|
| 5,639,994 A | 6/1997 | Tanaka |
| 2006/0044363 A1 | 3/2006 | Katayama |
| 2007/0000974 A1 | 1/2007 | Kubo |
| 2008/0117263 A1 | 5/2008 | Watanabe |
| 2008/0316255 A1 | 12/2008 | Kubo et al. |

FOREIGN PATENT DOCUMENTS

| | | |
|---|---|---|
| JP | S55-181366 | 12/1980 |
| JP | S60-042753 | 3/1985 |
| JP | H8-148788 | 6/1996 |
| JP | 2004-247352 | 9/2004 |
| JP | 2006-062211 | 3/2006 |
| JP | 2007-012899 | 1/2007 |
| JP | 2008-087338 | 4/2008 |
| JP | 2008-143167 | 6/2008 |
| JP | 2009-004419 | 1/2009 |

OTHER PUBLICATIONS

Decision to Grant a Patent for Japanese Application No. 2010-080659 dated Jul. 17, 2012.

*Primary Examiner* — Matthew Luu
*Assistant Examiner* — Henok Legesse
(74) *Attorney, Agent, or Firm* — Frommer Lawrence & Haug LLP

(57) ABSTRACT

A wiring board to be connected to an object includes: contact points to be connected to the object; wires connected to the contact points; and a substrate on which the contact points and the wires are formed. The substrate has a first portion which has openings and overlaps with the object when the wiring board is connected to the object, and a second portion which is continuous to the first portion. The contact points include first contact points formed in the first portion on one surface of the substrate facing the object, and second contact points formed in the second portion, on the other surface of the substrate, at areas which do not overlap with the first contact points when the substrate is bent so that the first portion is overlapped with the second portion.

13 Claims, 15 Drawing Sheets

SCANNING DIRECTION

PAPER FEEDING DIRECTION

SCANNING DIRECTION

PAPER FEEDING DIRECTION

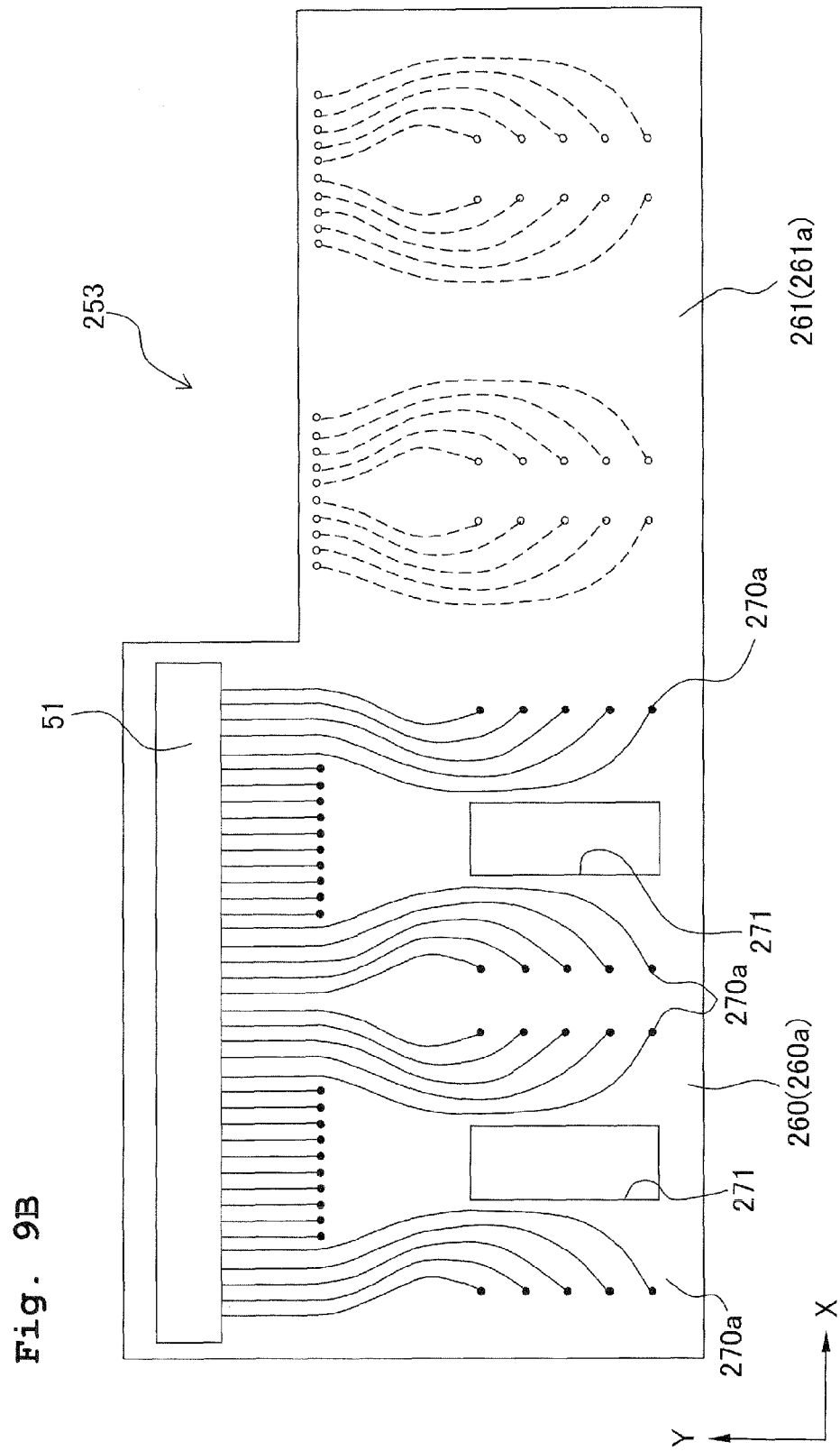

WIRING BOARD AND LIQUID JETTING HEAD

CROSS REFERENCE TO RELATED APPLICATION

The present application claims priority from Japanese Patent Application No. 2010-080659, filed on Mar. 31, 2010, the disclosure of which is incorporated herein by reference in its entirety.

BACKGROUND OF THE INVENTION

1. Field of the Invention

The present invention relates to a wiring board which is to be connected to an object, and a liquid jetting head.

2. Description of the Related Art

Wiring boards which transmit and receive signals and supply electric power upon being connected to various equipments have hitherto been known. For instance, in a field of recording apparatuses including a large number of recording elements, which record an image and characters on a recording medium such as a recording paper, in order to fulfill the requirement of a high-speed printing and a high-resolution printing, in recent years, there has been a tendency toward increase in the number of recording elements and a high densification. Therefore, with the increase in the number of recording elements, contact points on a substrate of a wiring board which are to be connected to contact points on an element side connected to the recording elements have increased, leading to a high densification, and drawing around of wires to the plurality of contact points on substrate side has been complicated.

Therefore, as a structure which makes the drawing around of wires easy, in a wiring body which is to be connected to a piezoelectric actuator of an ink-jet head described in U.S. Patent Application Publication No. 2008/0316255 (corresponds to Japanese Patent Application Laid-open No. 2009-4419), two wiring boards are stacked to overlap, and a plurality of contact points on substrate side corresponding to a plurality of contact points on element side of the piezoelectric actuator, and wires to be connected to the plurality of contact points on substrate side are formed to be distributed to the two wiring boards. Moreover, in one of the wiring boards facing the piezoelectric actuator, an opening is formed at a position facing the contact points on substrate side formed on the other wiring board, and from the opening, the contact points on substrate side formed on the other wiring board are exposed toward the piezoelectric actuator. In this manner, by arranging the plurality of contact points on substrate side, to be divided on two wiring boards, the drawing around of wires to the plurality of contact points on substrate side is made easy.

However, in the wiring body described in U.S. Patent Application Publication No. 2008-0316255, a highly densified arrangement of contact points has been realized by overlapping two wiring boards, and since a distance between the contact points is substantially small, it is necessary to join two wiring boards to the piezoelectric actuator which is to be connected, upon positioning accurately. However, when the two wiring boards are separate members, to position the wiring boards with a micro distance between the contact points is difficult and takes longer time. Moreover, when a force in a direction separating away from an object is exerted to any of the two wiring boards, the force is exerted only to the contact points on substrate side formed on the wiring board to which the force has been exerted. Therefore, a joining strength is low, and exfoliation and shifting of the wiring board from the object are easily occurred.

SUMMARY OF THE INVENTION

An object of the present invention is to provide a wiring board in which, upon making easy the drawing around of wires to the plurality of contact points on substrate side, positioning of a substrate with respect to a connecting portion of an object is carried out easily and quickly, and shifting (misalignment) and exfoliating of the substrate from the object is prevented, and a liquid jetting head which includes such wiring board.

According to a first aspect of the present invention, there is provided a wiring board which is to be connected to a connecting portion of an object, including: a plurality of contact points which are to be connected to the connecting portion of the object; a plurality of wires which are connected to the contact points; and a substrate on which the contact points and the wires are formed, and which has a first portion which has openings and overlaps with the connecting portion of the object when the wiring board is connected to the object, and a second portion which is continuous to the first portion, and the contact points include first contact points which are formed in the first portion on one surface of the substrate facing the object, and second contact points which are formed in the second portion, on the other surface of the substrate, at areas which do not overlap with the first contact points when the substrate is bent so that the first portion is overlapped with the second portion, and the second contact points are exposed to the one surface of the substrate through the openings formed in the first portion when the substrate is bent so that the first portion is overlapped with the second portion.

According to the first aspect of the present invention, the plurality of contact points are formed as the first contact points and the second contact points, to be distributed in the first portion on one surface of the substrate and in the second portion on the other surface of the substrate. Consequently, when the substrate is bent so that the first portion and the second portion are overlapped with each other, it is possible to expose the second contact points formed on the other surface of the second portion from the openings formed in the first portion, while making the one surface of the first portion face the connecting portion of the object, and it is possible to connect the second contact points to the connecting portion of the object together with the first contact points formed on one surface of the first portion. Accordingly, it is possible to draw around the plurality of wires to be connected to the first contact points and the second contact points upon distributing to the first portion and the second portion, and it is possible to draw around easily the plurality of wires to the plurality of contact points. At this time, since the substrate is bent so that the first portion and the second portion are overlapped with each other, a planar size of the substrate is same as in a case in which the substrate only has the first portion and does not have the second portion.

Moreover, since the first portion and the second portion are continuous, it is possible to position the first portion and the second portion easily when the substrate is bent. Consequently, only by positioning any one of the first portion and the second portion with respect to the connecting portion of the object, it is possible to position the connecting portion, the first portion, and the second portion easily and rapidly. Furthermore, when a force in a direction separating away from the object is exerted to the first portion or the second portion of the substrate, since the first portion and the second portion are connected, it is possible to distribute the force to all the contact points, thereby making a joining strength high, and it is possible to prevent exfoliation and shifting of the wiring board from the object.

According to a second aspect of the present invention, there is provided a wiring board which is to be connected to a connecting portion of an object, including: a plurality of contact points which are to be connected to the connecting portion of the object; a plurality of wires which are connected to the contact points; and a substrate on which the contact points and the wires are formed, and which has a first portion which overlaps with the connecting portion of the object when the wiring board is connected to the object and a second portion which is continuous to the first portion, and the contact points are formed in the first portion on one surface of the substrate facing the object, a fifth connecting contact point, which overlaps with one contact point of the contact points and is connected to the one contact point via an electroconductive material penetrating the substrate, is formed on the other surface of the substrate, and a sixth connecting contact point is formed in the second portion on the other surface of the substrate so that the sixth connecting contact point is connected to the fifth connecting contact point when the substrate is bent so that the first portion is overlapped with the second portion.

According to the second aspect of the present invention, the plurality of contact points is formed on one surface of the first portion of the substrate. Accordingly, it is possible to connect the plurality of contact points to the connecting portion of the object upon letting the one surface of the first portion face the connecting portion of the object. Moreover, some of the plurality of contact points are connected to the sixth connecting contact points formed on the other surface of the second portion, via the firth connecting contact points. Accordingly, it is possible to draw around the plurality of wires to the plurality of contact points upon distributing to the first portion and the second portion, and it is possible to draw around easily the plurality of wires to the plurality of contact points. At this time, since the substrate is bent so that the first portion and the second portion are overlapped with each other, a planar size of the substrate is same as in a case in which the substrate has only the first portion and does not have the second portion.

BRIEF DESCRIPTION OF THE DRAWINGS

FIG. 4A is a perspective view and FIG. 4B is a side view when seen from a paper feeding direction;

FIG. 6A is a rear view and FIG. 6B is a front view;

FIG. 7A is a cross-sectional view taken along a line VIIA-VIIA in FIG. 5, and FIG. 7B is a cross-sectional view taken along a line VIIB-VIIB in FIG. 5;

FIG. 8A is a plan view when the FPC which has been bent is seen from a lower side, and FIG. 8B is a cross-sectional view taken along a line VIIIB-VIIIB in FIG. 8A;

FIG. 9A, FIG. 9B, and FIG. 9C (hereinafter, 'FIG. 9A to FIG. 9C') are diagrams for explaining a second modified embodiment, where, FIG. 9A is a plan view when the FPC which has been bent is seen from a lower side, and FIG. 9B and FIG. 9C are diagrams corresponding to FIG. 6A and FIG. 6B in the second modified embodiment;

FIG. 10A is a plan view of the FPC before being bent and connected to the actuator unit, and FIG. 10B is a plan view when the FPC which has been bent is seen from a lower side.

DETAILED DESCRIPTION OF THE PREFERRED EMBODIMENTS

Figure 1:
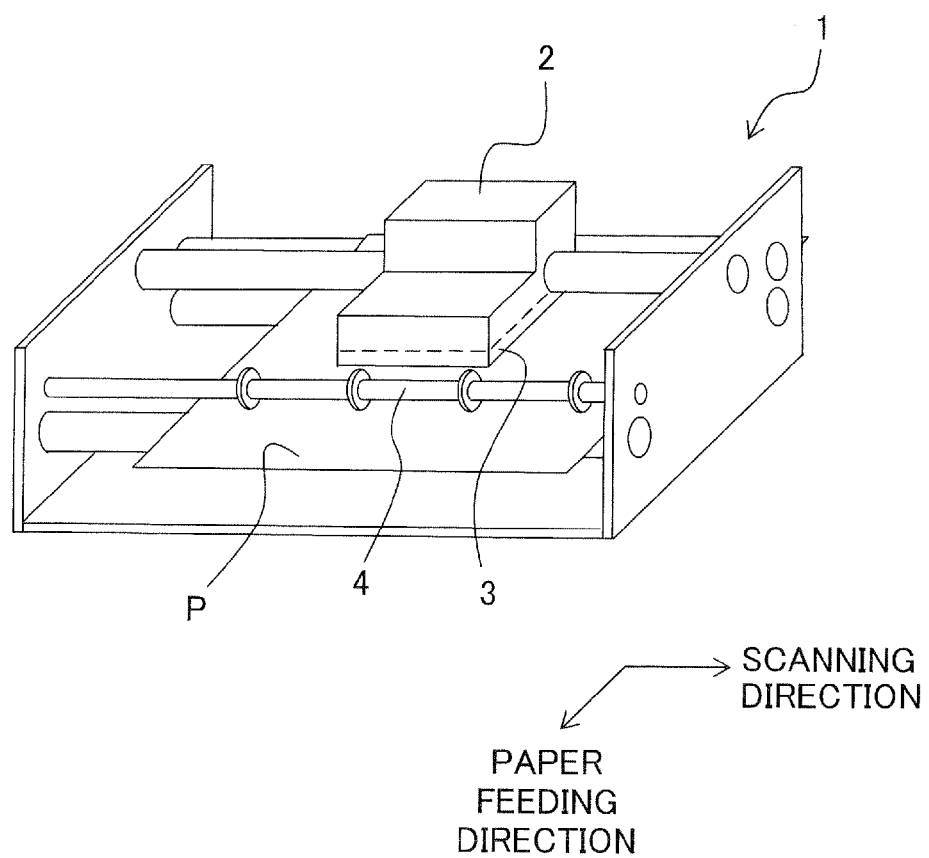
FIG. 1 is a schematic structural view of a printer according to an embodiment of the present invention.

Exemplary embodiments of the present invention will be described below. As shown in FIG. 1, a printer 1 includes a carriage 2, an ink-jet head 3 (a liquid jetting head), and a transporting roller 4.

The carriage 2 reciprocates in a scanning direction (left-right direction in FIG. 1). The ink jet head 3 is installed on a lower surface of the carriage 2, and jets an ink from a nozzle 35 formed in a lower surface thereof (refer to FIG. 3). The transporting roller 4 transports a recording paper P in a paper feeding direction (a frontward direction in FIG. 1). Moreover, in the printer 1, an image and characters are recorded on the recording paper P by an ink jetted from the nozzles 35 of the ink-jet head 3 which reciprocates in the scanning direction together with the carriage 2. The recording paper P is transported in the paper feeding direction by the transporting roller 4. The recording paper P having an image and characters recorded thereon is discharged in the paper feeding direction by the transporting roller 4.

Figure 2:
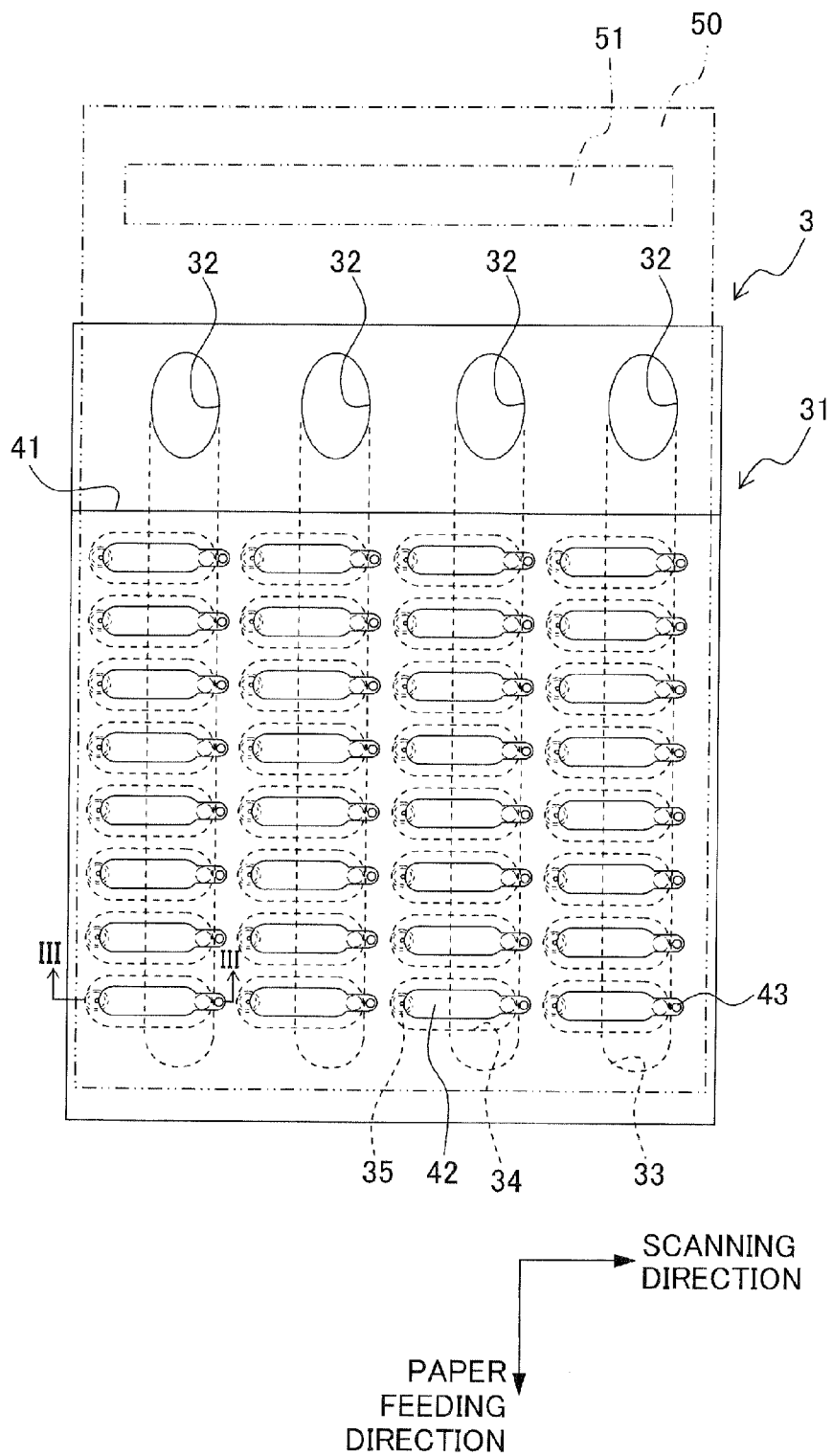
FIG. 2 is a plan view of an ink-jet head.
Figure 3:
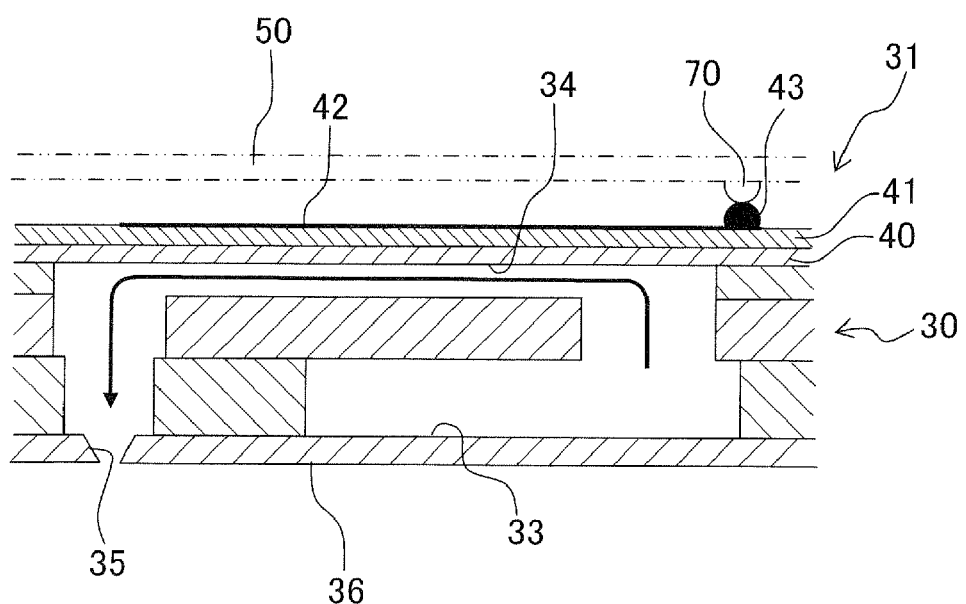
FIG. 3 is a cross-sectional view taken along a line in FIG. 2.

Next, the ink-jet head 3 will be described below by referring to FIG. 2 and FIG. 3. In a plan view of an ink-jet head shown in FIG. 2, an FPC (flexible printed circuit) 50 arranged at an upper side of an actuator unit 31 is indicated by alternate long and two short dashes lines. As shown in FIG. 2 and FIG. 3, the ink-jet head 3 includes a channel unit 30 in which ink channels are formed, the actuator unit 31 (an object, a pressure applying mechanism) of a piezoelectric type which applies a jetting pressure to the ink inside the ink channels, and a flexible wiring board 50 (FPC) which covers an upper surface of the actuator unit 31.

Four ink supply ports 32 which are to be connected to four ink cartridges respectively, not shown in the diagram, four manifolds 33 which are extended along a vertical direction (paper feeding direction) in FIG. 2, orthogonal to a scanning direction upon branching (bifurcating) from the ink supply ports 32, a plurality of pressure chambers 34 which communicate with the manifolds 33, and a plurality of nozzles 35 which communicate with the plurality of pressure chambers 34 respectively are formed in the channel unit 30. The plurality of nozzles 35 and the plurality of pressure chambers 34 are aligned in the paper feeding direction and form a nozzle row and a row of pressure chambers, and four such nozzle rows and four rows of pressure chambers are aligned in the scanning direction. Inks of colors in order of magenta, cyan, yellow, and black are jetted from nozzles 35 belonging to nozzle rows from left side in FIG. 2.

The actuator unit 31 includes a vibration plate 40 which is joined to the channel unit 30 to cover the plurality of pressure chambers 34, a piezoelectric layer 41 which is arranged on an upper surface of the vibration plate 40, a plurality of individual electrodes 42 which are provided corresponding to the plurality of pressure chambers 34, on an upper surface of the piezoelectric layer 41, and a plurality of object-side bumps 43 which are formed at an end portion of the plurality of individual electrodes 42. The vibration plate 40 is formed of a metallic material, and is kept at a ground electric potential. The actuator unit 31 is structured such that when a predetermined drive pulse signal is supplied to the individual electrode 42 from a driver IC 51 of the FPC 50 which will be described later, due to an electric field generated between the individual electrode 42 and the vibration plate 40, the piezoelectric layer 41 between the individual electrode 42 and the vibration plate 40 undergoes a piezoelectric distortion, and a bending deformation is generated in the vibration plate 40. By changing a volume of the pressure chamber 34 due to the bending deformation of the vibration plate 40, a pressure is applied to the ink inside the pressure chamber 34, and the ink is jetted from the nozzle 35 which communicates with the pressure chamber 34. The plurality of object-side bumps 43 are arranged to be aligned at a predetermined interval in the paper feeding direction, corresponding to the plurality of nozzles 35, and four rows of the object-side bumps 43 aligned in such manner are arranged in the scanning direction.

Next, the FPC 50 will be described below by referring to diagrams from FIG. 3 to FIG. 7B. Plan views of the FPC shown in FIG. 5 and FIG. 6 are schematic diagrams in which the number of bumps to be connected to bumps of the individual electrodes of the actuator unit is reduced for simplifying the description. The schematic FPC is used for the following description.

Figure 4A:
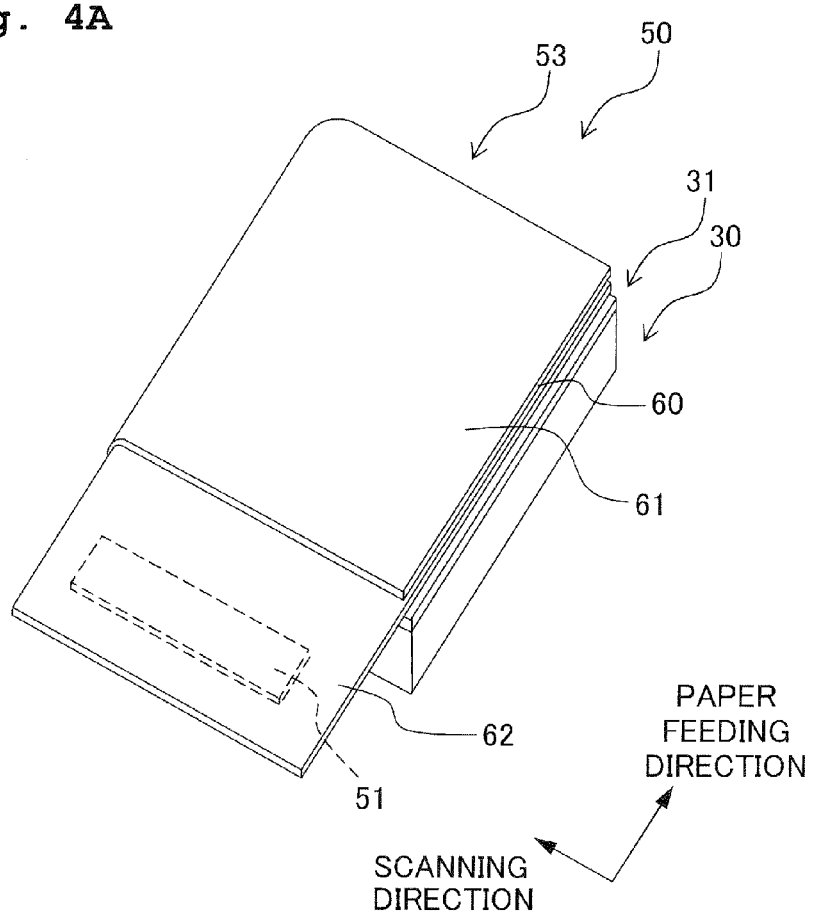
FIG. 4A and FIG. 4B are diagrams explaining about an FPC (flexible printed circuit) which is connected to an actuator unit, where.
Figure 4B:
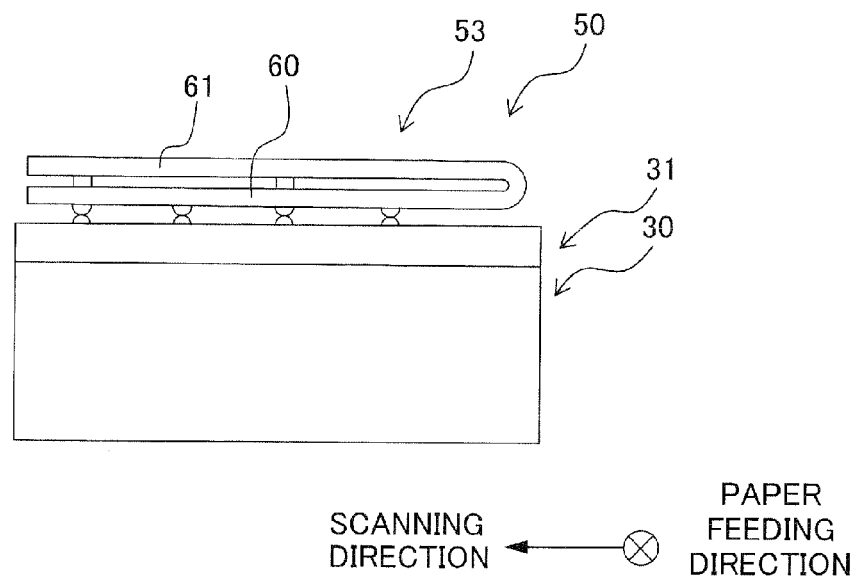
Figure 5:
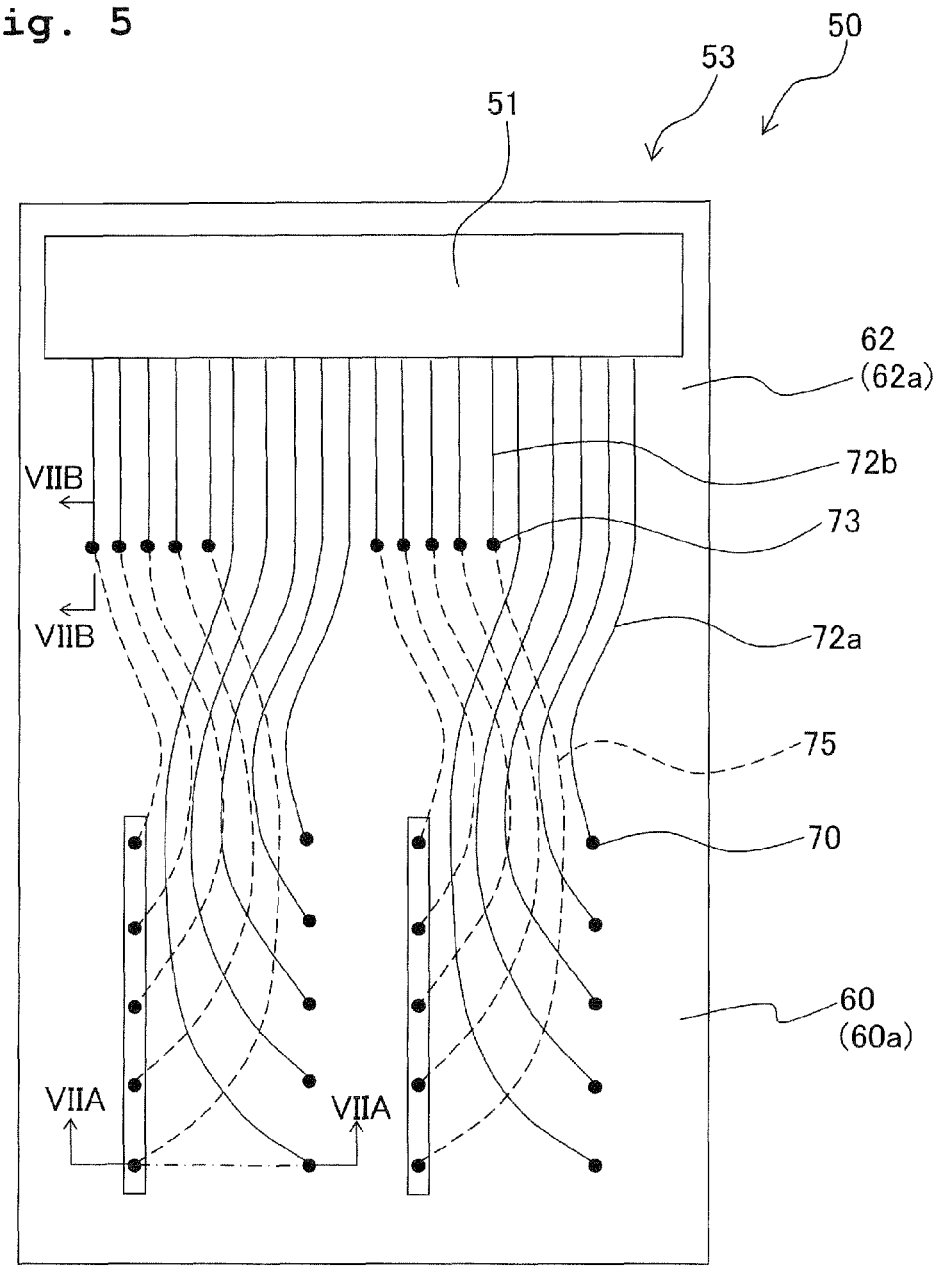
FIG. 5 is a plan view when the FPC which has been bent is seen from a lower side.

As shown in FIG. 3, FIG. 4A, FIG. 4B, and FIG. 5, the FPC 50 includes a substrate 53 and a plurality of substrate-side bumps 70 to be connected to the plurality of object-side bumps 43 formed on the upper surface (connecting portion) of the piezoelectric layer 41 of the actuator unit 31. Moreover, as shown in FIG. 4A and FIG. 4B, the FPC 50 is arranged on the upper surface of the actuator unit 31 in a state of the substrate 53 bent and overlapped in a direction of thickness. In the following description, a surface of the substrate 53 facing the actuator unit 31 is let to be a rear surface, and a surface on the opposite side is let to be a front surface. The rear surface (front surface) of the substrate 53 in the embodiment corresponds to one surface (the other surface) of the substrate according to the present invention.

The substrate 53 is made of an insulating resin material such as polyimide, and is flexible. Moreover, the substrate 53, as shown in FIG. 6A and FIG. 6B, when an X-direction is let to be the scanning direction, includes a first portion 60 having a same size in a planar direction as the piezoelectric layer 41, a second portion 61 having a planar shape similar to the first portion 60, which is connected to the first portion 60, and is arranged to be aligned with the first portion 60 in the X-direction, and a third portion 62 which is connected to the first portion 60 and arranged to be aligned with the first portion 60 in a Y-direction which is orthogonal to the X-direction.

The substrate 53 is bent such that a front surface 60b of the first portion 60 and a front surface 61b of the second portion 61 are face-to-face, and is arranged such that a rear surface 60a of the first portion is facing the piezoelectric layer 41 of the actuator unit 31. Accordingly, the second portion 61 overlaps with the first portion 60, on a side of the first portion 60 opposite to the actuator unit 31. Moreover, the third portion 62 is arranged not to overlap with the second portion 61.

Figure 6A:
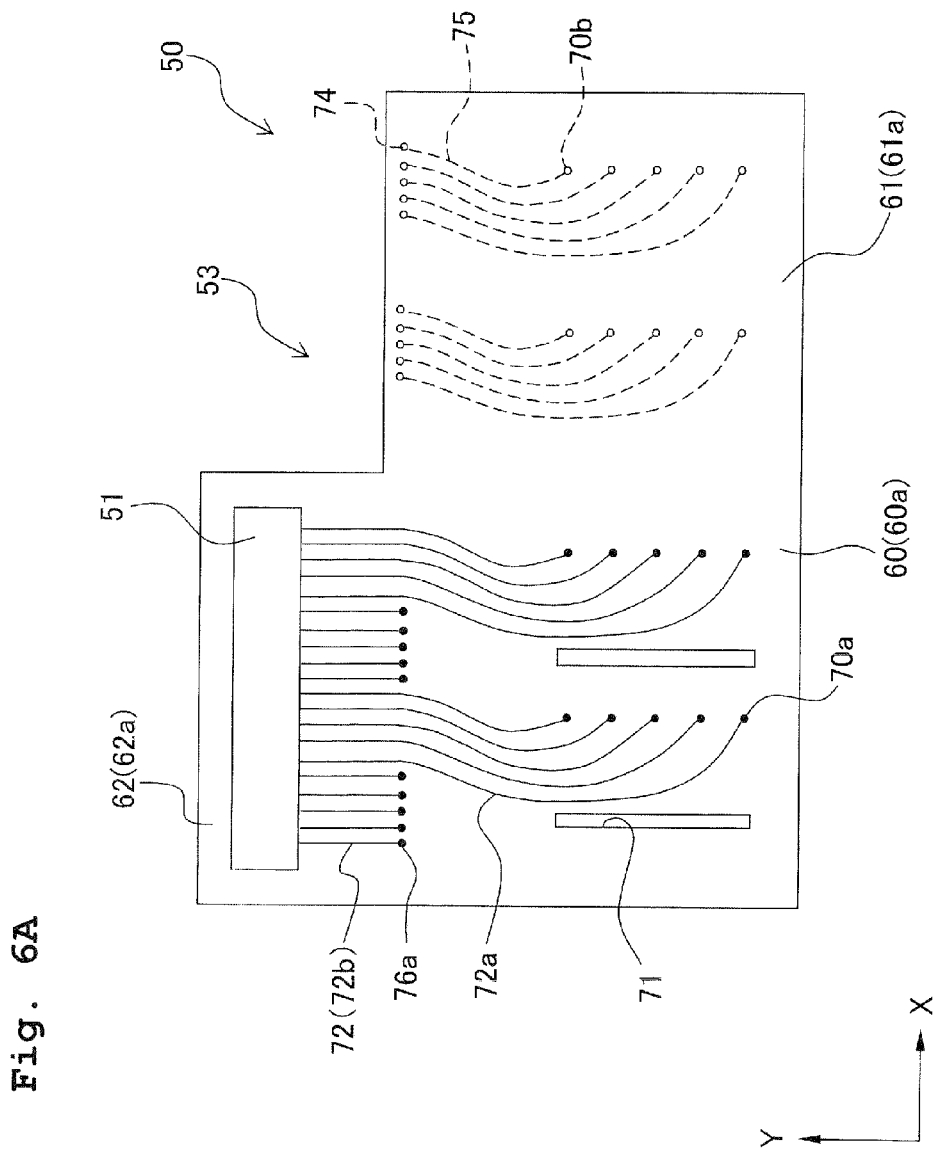
FIG. 6A and FIG. 6B are plan views of the FPC before being bent and connected to the actuator unit, where.
Figure 6B:
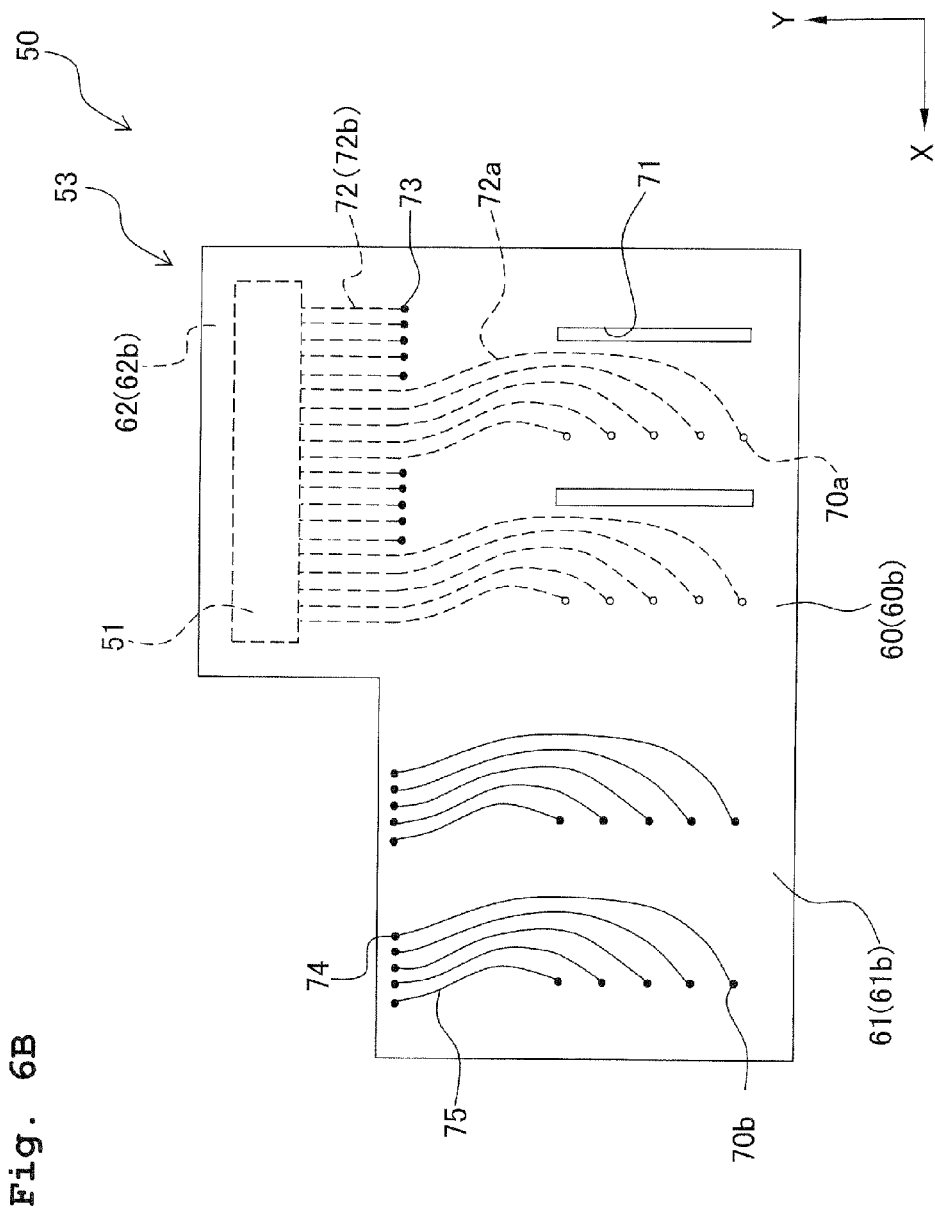

As shown in FIG. 6A and FIG. 6B, the driver IC 51 having a rectangular shape extended in the X-direction is arranged on a rear surface 62a of the third portion 62 of the substrate 53. The driver IC 51 supplies a drive pulse signal to each of the plurality of individual electrodes 42.

First substrate-side bumps 70a which are a part of the substrate-side bumps 70 are formed on the rear surface 60a of the first portion 60. The first substrate-side bumps 70a are arranged to be aligned at a predetermined interval in the Y-direction corresponding to the object-side bumps 43 of the actuator unit 31, and two rows of the first substrate-side bumps 70a are arranged side-by-side.

Second substrate-side bumps 70b which are remaining substrate-side bumps 70 are formed on the front surface 61b of the second portion 61. The second substrate-side bumps 70b, similarly as the first substrate-side bumps 70a are arranged to be aligned at a predetermined interval in the Y-direction corresponding to the object-side bumps 43 of the actuator unit 31, and two rows of the second substrate-side bumps 70b are arranged side-by-side. When the substrate 53 is bent so that the first portion 60 and the second portion 61 are overlapped, the row of the first substrate-side bumps 70a and the row of the second substrate-side bumps 70b are arranged to be aligned alternately in the X-direction in a plan view. At this time, a distance between the adjacent rows of the first substrate-side bumps 70a and the second substrate-side bumps 70b is same as an interval between the two adjacent rows of the object-side bumps 43.

Moreover, two openings 71 penetrating through a direction of thickness are formed in the first portion 60, at positions facing the two rows of the second substrate-side bumps 70b, when the first portion 60 and the second portion 61 are overlapped. Each opening 71 has a rectangular shape extended in the Y-direction. The two openings 71 are arranged to be aligned in the X-direction, alternately with the rows of the first substrate-side bumps 70a, and when the first portion 60 and the second portion 61 are overlapped, the second substrate-side bumps 70b are exposed to the rear surface 60a of the first portion 60 from the two openings 71. A width in the X-direction of each of the openings 71 is almost same as a width in the X-direction of each of the bumps formed on the substrate 53 (for instance, in the embodiment, the width in the X-direction of the opening 71 is 200 μm, and a diameter of the bump is 180 μm).

Furthermore, a plurality of first wires 72a connected to the driver IC 51 are formed on the rear surface 60a of the first portion 60 and the rear surface 62a of the third portion 62. Some first wires 72a from among the first wires 72 have one ends connected to the driver IC 51, and the other ends connected to the corresponding first substrate-side bumps 70a. Each first wire 72a is drawn around through a space between the row of the first substrate-side bumps 70a in the corresponding first substrate-side bumps 70a, and the opening 71 adjacent to the row of the first substrate-side bumps 70a.

First connecting bumps 73 are formed on the front surface 60b of the first portion 60, in areas not overlapping with the bundle of the first wires 72a connected to the first substrate-side bumps 70a. The first connecting bumps 73 are arranged to be aligned in the X-direction at an end portion toward the third portion 62 in the Y-direction. Remaining first wires 72b from among the first wires 72 have one ends thereof connected to the driver IC 51, and the other ends, upon being drawn in the Y-direction, connected to the corresponding first connecting bumps 73 via through holes 76 (refer to FIG. 7B). An electroconductive material 76a (an electroconductive material inserted through the substrate) is filled in each of the through holes 76.

Second connecting bumps 74 which face and are to be connected to the first connecting bumps 73 are formed on the front surface 61b of the second portion 61, at positions overlapping with the first connecting bumps 73 in a plan view, when the first portion 60 and the second portion 61 are overlapped. Furthermore, second wires 75 which connect the second connecting bumps 74 and the second substrate-side bumps 70b respectively are formed on the front surface 61b of the second portion 61.

In such structure of the FPC 50, as shown in FIG. 5, when the first portion 60 and the second portion 61 are overlapped by the substrate 53 being bent, some of the first wires 72a from among the plurality of first wires 72 having one end connected to the driver IC 51 are drawn around through a space between the row of the first substrate-side bumps 70a and the opening 71 adjacent to the row of first substrate-side bumps 70a in the X-direction, and the other ends of the first wires 72a are connected to the corresponding first substrate-side bumps 70a. The remaining first wires 72b from among the plurality of first wires 72 having one ends connected to the driver IC, have the other ends connected to the first connecting bumps 73, and the first connecting bumps 73 are connected to the second connecting bumps 74 respectively. The second wires 75 having one ends connected to the second connecting bumps 74, while intersecting the first wires 72a in a plan view, have the other ends connected to the corresponding second substrate-side bumps 70b. Here, each row of the substrate-side bumps 70 corresponds to the row of nozzles 35, and the row of nozzles 35 corresponds to the color of the ink to be jetted from that nozzle 35. Therefore, the plurality of first wires 72 are grouped according to the color of the ink to be jetted from the corresponding nozzles 35, and are connected to the driver IC 51 in a state of being aligned in the X-direction.

Figure 7A:
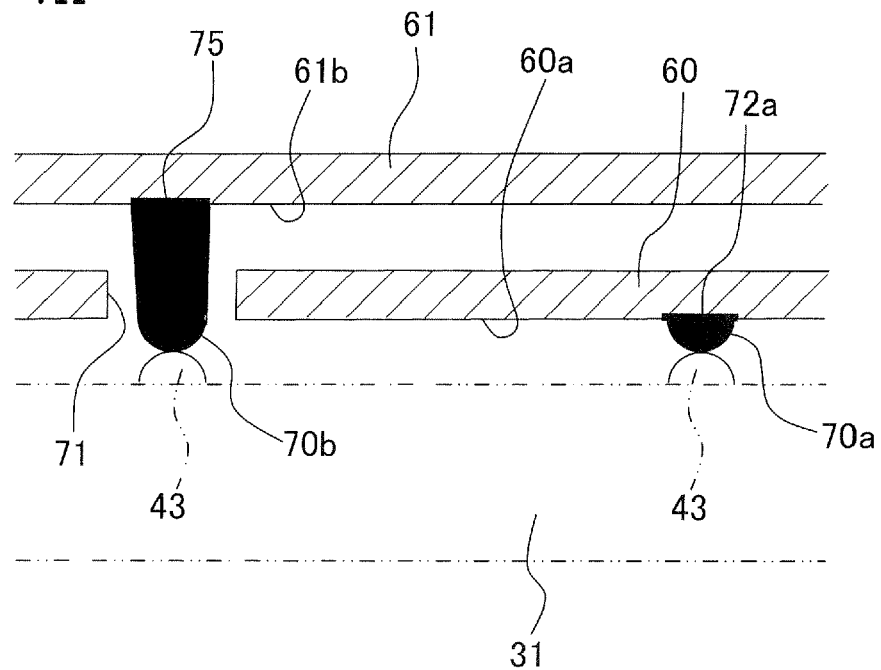
FIG. 7A and FIG. 7B are cross-sectional views of the FPC which has been bent, where.

At this time, the second substrate-side bump 70b formed on the front surface 61b of the second portion 61 are exposed toward the rear surface 60a of the first portion 60 from the openings 71 formed in the first portion 60. Moreover, as shown in FIG. 7A, an apex of each of the second substrate-side bumps 70h is arranged on the same plane as an apex of one of the first substrate-side bumps 70a formed on the rear surface 61a of the first portion 60.

Next, a connection between the FPC 50 and the actuator 31 will be described below. Firstly, the rear surface 60a of the first portion 60 of the substrate 53 is arranged face-to-face with the upper surface of the piezoelectric layer 41 of the actuator unit 31 so that the X-direction coincides with the scanning direction. At this time, the first substrate-side bumps 70a formed on the rear surface 60a of the first portion 60, and the object-side bumps 43 aligned in the Y-direction in a first row and a third row from a left side in FIG. 2 among the plurality of object-side bumps 43 formed on the upper surface of the piezoelectric layer 41 of the actuator unit 31 are connected upon positioning. When the first substrate-side bumps 70a and the object-side bumps 43 in the first row and the third row are connected, the opening 71 formed in the first portion 60 of the substrate 53 and the object-side bumps 43 aligned in the Y-direction in a second row and a fourth row from the left side in FIG. 2 are facing mutually.

Thereafter, when the substrate 53 is bent so that the second portion 61 is overlapped on the first portion 60, the second substrate-side bumps 70b formed on the front surface 61b of the second portion 61 are exposed toward the rear surface 60a of the first portion 60 through the openings 71 formed in the first portion 60. Moreover, the second substrate-side bumps 70b which are exposed toward the rear surface 60a of the first portion 60 are connected without being positioned, to the object-side bumps 43 aligned in the Y-direction in the second row and the fourth row from the left side in FIG. 2. At this time, the FPC 50 has a width in the scanning direction similar to a width in the scanning direction of the actuator unit 31 as shown in FIG. 4A and FIG. 4B. Moreover, as shown in FIG. 4A, the third portion 62 on which the driver IC 51 is arranged is extended beyond one end portion of the actuator unit 31 in the paper feeding direction.

According to the FPC 50 in the embodiment, the plurality of substrate-side bumps 70 are formed as the first substrate-side bumps 70a and the second substrate-side bumps 70b, to be distributed to the rear surface 60a of the first portion 60 of the substrate 53 and the front surface 61b of the second portion 61 of the substrate 53 respectively. Consequently, when the substrate 53 is bent so that the first portion 60 and the second portion 61 are overlapped, the second substrate-side bumps 70b formed on the front surface 61b of the second portion 61 are exposed toward the rear surface 60a of the first portion 60 from the openings 71 formed in the first portion 60. Therefore, it is possible to connect the second substrate-side bumps 70b to the object-side bumps 43 formed on the piezoelectric layer 41 of the actuator unit 31, along with the first substrate-side bumps 70a formed on the rear surface 60a of the first portion 60. Moreover, it is possible to draw around the plurality of wires to be connected to the first substrate-side bumps 70a and the second substrate-side bumps 70b, upon distributing to the first portion 60 and the second portion 61. Therefore, it is possible to reduce the number of wires to be drawn between the two adjacent rows of bumps as compared to a case in which the plurality of substrate-side bumps 70 are to be formed only on the rear surface 60a of the first portion 60 of the substrate 53 and the plurality of wires are to be drawn to the plurality of substrate-side bumps 70 by using only the first portion, for instance.

Concretely, in a case in which the plurality of substrate-side bumps 70 are to be formed only on the rear surface 60a of the first portion 60 of the substrate 53, and the plurality of wires are to be drawn around to the plurality of substrate-side bumps 70 from the driver IC 51 for instance, the maximum number of wires to be drawn between the two rows of the substrate-side bumps 70, which are adjacent in the X-direction, is 10, and drawing around of the wires is extremely difficult. Whereas, in the embodiment, as shown in FIG. 6A, it is possible to use an area on the rear surface 60a of the first portion 60 of the substrate, between one row of the first substrate-side bumps 70a and one of the openings 71 through which one of the rows of the second substrate-side bumps 70b is exposed and which is adjacent to the one row of the first substrate-side bumps 70a, only for drawing around the wires which are connected to the first substrate-side bumps 70a. Therefore, the maximum number of wires which are to be drawn around between the one row of the first substrate-side bumps 70a and one row of the second substrate-side bumps 70b which is adjacent in the X-direction is 5, and the drawing around of wires to the first substrate-side bumps 70a becomes easy. Moreover, on the front surface 61b of the second portion 61 of the substrate 53, no row of the first substrate-side bumps 70a is formed and only the rows of the second substrate-side bumps 70b are formed. Therefore, an area between the rows of the second substrate-side bumps 70b which are adjacent in the X-direction is wider than an area between the row of the second substrate-side bumps 70b and the adjacent row of the first substrate-side bumps 70a on the first portion 60, and the drawing around of the wires to the second substrate-side bumps 70b becomes easy. Consequently, it is possible to draw around the plurality of wires from the driver IC 51 to the plurality of substrate-side bumps 70. At this time, since the substrate 53 is bent so that the first portion 60 and the second portion 61 are overlapped, a planar size of the substrate 53 is same as in a case in which the substrate 53 has only the first portion 60 and does not have the second portion 61.

Since the first portion 60 and the second portion 61 are in continuity as one substrate 53, it is possible to position easily when the substrate 53 is bent so that the first portion 60 and the second portion 61 are overlapped with each other. Consequently, only by positioning the first portion 60 of the substrate 53 with respect to the piezoelectric layer 41 of the actuator unit 31, it is possible to carry out the positioning of the actuator unit 31, the first portion 60, and the second portion 61 easily and rapidly. Furthermore, when a force in a direction of separating away from the actuator unit 31 is exerted to the first portion 60 or the second portion 61 of the substrate 53, since the first portion 60 and the second portion 61 are connected, it is possible to distribute the force exerted to all the substrate-side bumps 70, and to strengthen a connecting strength. Accordingly, it is possible to prevent exfoliation and shifting of the substrate 53 from the actuator unit 31.

Concretely, the first portion 60 and the second portion 61 are overlapped by the substrate 53 being bent, the first substrate-side bumps 70a formed on the first portion 60 and the second substrate-side bumps 70b exposed toward the rear surface 60a of the first portion 60 from the opening 71 in the first portion 60 are aligned at a short interval for each row, and are joined to the object-side bumps 43 of the actuator unit 31. Therefore, it is easy to distribute the force exerted in the direction away from the actuator 31 to the substrate-side bumps 70 formed on the other side of the first portion 60 and the second portion 61, in addition to the substrate-side bumps 70 formed on one side of the first portion 60 and the second portion 61, and it is possible to prevent further the exfoliation and shifting of the substrate 53 from the actuator unit 31. Moreover, even in a case in which the substrate 53 undergoes thermal expansion due to heat generated by the driver IC 51, since the opening 71 is formed, it is possible to suppress a thermal deformation, and it is possible to prevent the substrate 53 from being exfoliated from the actuator unit 31.

Furthermore, when the first portion 60 and the second portion 61 are overlapped by the substrate 53 being bent, the driver IC 51 is not interposed between the first portion 60 and the second portion 61, and it is possible to improve a parallelism of the first portion 60 and the second portion 61 which are overlapped. Moreover, it is possible to align the first portion 60 and the second portion 60 only by bending the substrate 53, and it is possible to connect the second substrate-side bump 70b formed on the front surface 61b of the second portion and the object-side bump 43 formed on the actuator unit 31 firmly. Furthermore, since it is possible to connect the second substrate-side bumps 70b formed on the second portion 61 directly to the object-side bumps 43 of the actuator unit 31 via the opening 71 formed in the first portion 60, it is possible reduce improper connection.

Figure 7B:
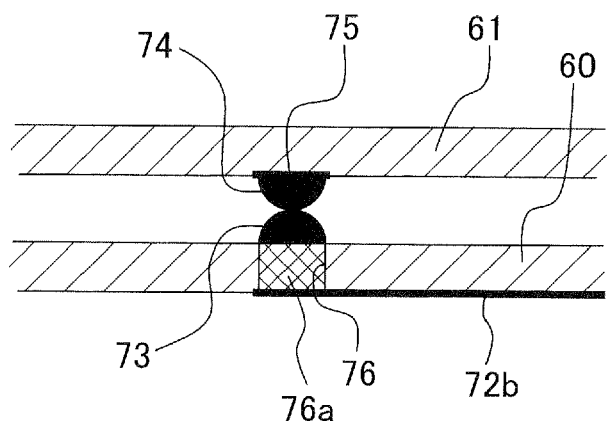

Moreover, in a case of overlapping the first portion 60 and the second portion 61 by bending the substrate 53, it is possible to connect the second wires to be connected to the second substrate-side bumps 70b formed on the front surface 61b of the second portion 61 and the first wires 72b to be connected to the driver IC 51 via the second connecting bumps 74, the first connecting bumps 73, and the electroconductive materials 76 filled in the through holes 76 as shown in FIG. 7B. Therefore, it is possible to shorten a length of wires, and to reduce an electrical resistance of the wires.

Moreover, when the substrate 53 is bent so that the first portion 60 and the second portion 61 are overlapped with each other, the second substrate-side bump 70b formed on the second portion 61 is connected to the driver IC 51 formed on the third portion 62, by the first connecting bump 73 and the second connecting bump 74 being connected. Therefore, it is not necessary to provide separately the driver IC 51 which is to be connected directly to the second substrate-side bump 70b, and it is possible to connect the first substrate-side bump 70a and the second substrate-side bump 70b to one driver IC 51.

Next, a modified embodiments in which, various modification are made in the embodiment will be described below. However, same reference numerals are assigned to components having a structure similar as in the abovementioned embodiment, and description of such components is omitted appropriately.

In the embodiment, the structure has been let to be such that the substrate-side bumps 70 are formed to be distributed on the rear surface 60a of the first portion 60 of the substrate 53 and the front portion 61b of the second portion 61 of the substrate 53, and when the substrate 53 is bent so that the first portion 60 and the second portion 61 are overlapped with each other, the second substrate-side bump 70b is exposed toward the rear surface 60a of the first portion 60 from the opening 71 formed in the first portion 60, and is connected to the object-side bump 43 formed on the piezoelectric layer 41, and the wires from the driver IC 51 to the substrate-side bumps 70 have been drawn to be distributed around the first portion 60 and the second portion 61. However, it is also possible to form all the substrate-side bumps 70 on the first portion 60 of the substrate 53, and to draw the wires from the driver IC 51 to the substrate-side bumps 70 to be distributed around the first portion 60 and the second portion 61 (a first modified embodiment). Next, the first modified embodiment will be described below by referring to FIG. 8A and FIG. 8B.

Figure 8A:
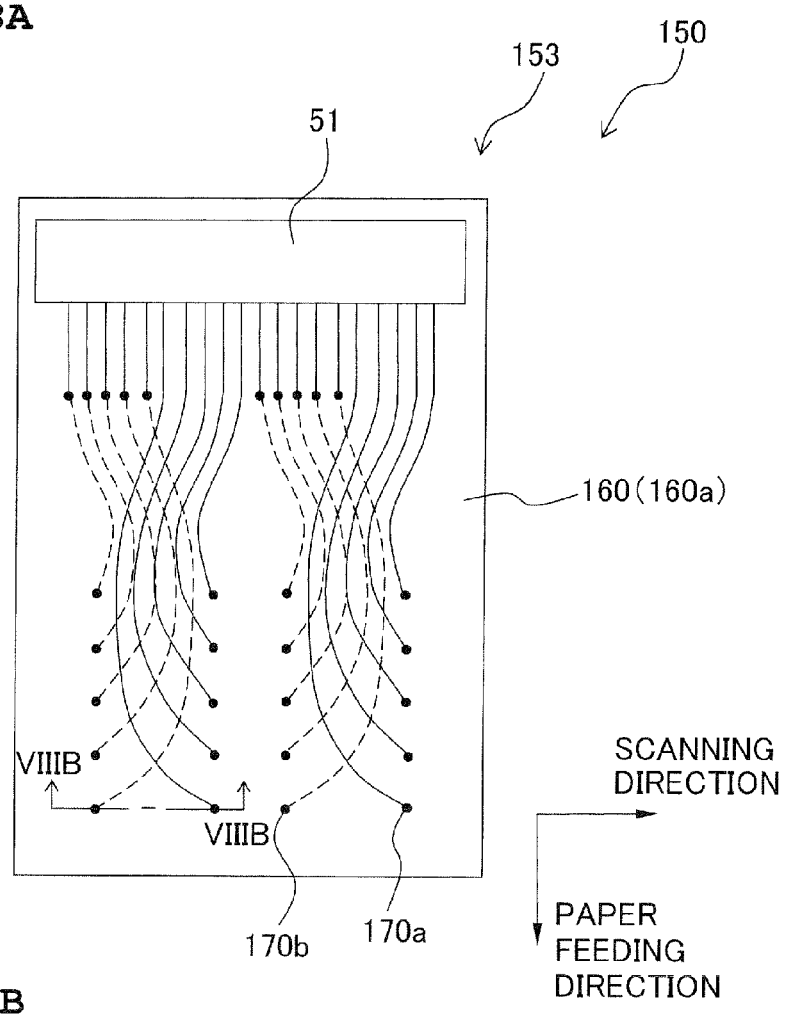
FIG. 8A and FIG. 8B are diagrams explaining a first modified embodiment, where.

As shown in FIG. 8A, all substrate-side bumps 170 which are to be connected to the object-side bump 43 of the actuator 31 are formed on a rear surface 160a of a first portion 160 facing the actuator unit 31, of a substrate 153 of an FPC 150. Substrate-side bumps 170 in a second row and a fourth row from a left side in FIG. 8A from among the plurality of substrate-side bumps 170 correspond to the first substrate-side bumps 70a in the abovementioned embodiment, and are connected to the driver IC 51 similarly as the first substrate-side humps 70a. Connection of substrate-side bumps 170b in a first row and a third row from left side in FIG. 8A from among the plurality of substrate-side bumps 170 will be described below.

Figure 8B:
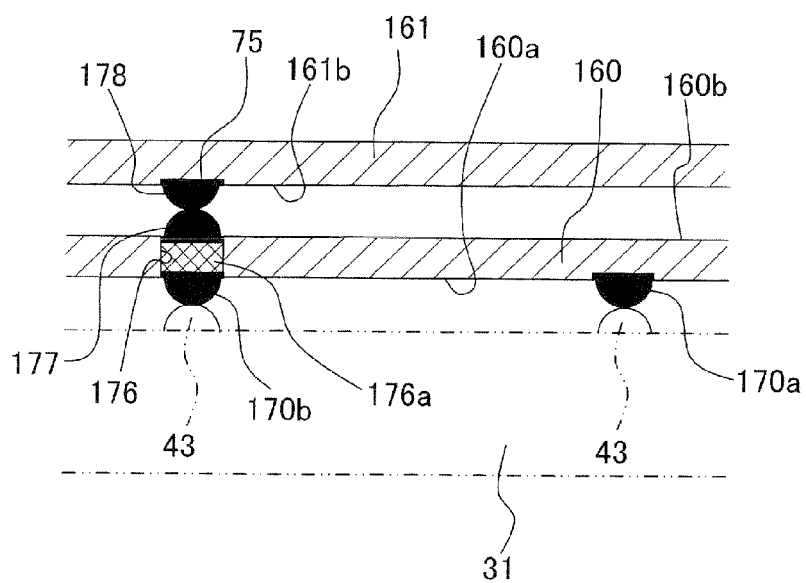

As shown in FIG. 8B, a third connecting bump 177 which overlaps with the substrate-side bump 170b in a plane view and which is connected to the respective substrate-side bump 170b via an electroconductive material 176a filled in a through hole 176 is formed on a front surface 160b of the first portion 160 of the substrate 153. A fourth connecting bump 178 which overlaps with the third connecting bump 177 in a plan view when the substrate 53 is bent so that the first portion 160 and a second portion 161 are overlapped with each other, and which is to be connected to the third connecting bump 177 is formed on a front surface 161b of the second portion 161. The fourth connecting bump 178 is connected to the second wire 75 similarly as the second substrate-side bump 70b in the abovementioned embodiment. Connection of the second wire 75 and the driver IC 51 being similar as in the abovementioned embodiment, the description thereof is omitted. According to this structure also, it is possible show an effect similar as in the abovementioned embodiment. Moreover, since all of the plurality of substrate-side bumps 170 to be connected to the actuator unit 31 are formed on the first portion 160, as in the abovementioned embodiment, a height of contact points is susceptible to be uniform, and it is possible to reduce improper connection with the object-side bump 43 of the actuator unit 31, as compared to a case in which, some of the second substrate-side bumps 70b are formed on the second area 161. The third connecting bump 177 (the fourth connecting bump 178) in the first modified embodiment corresponds to a fifth connecting contact point (sixth connecting contact point) according to the present invention.

Figure 9A:
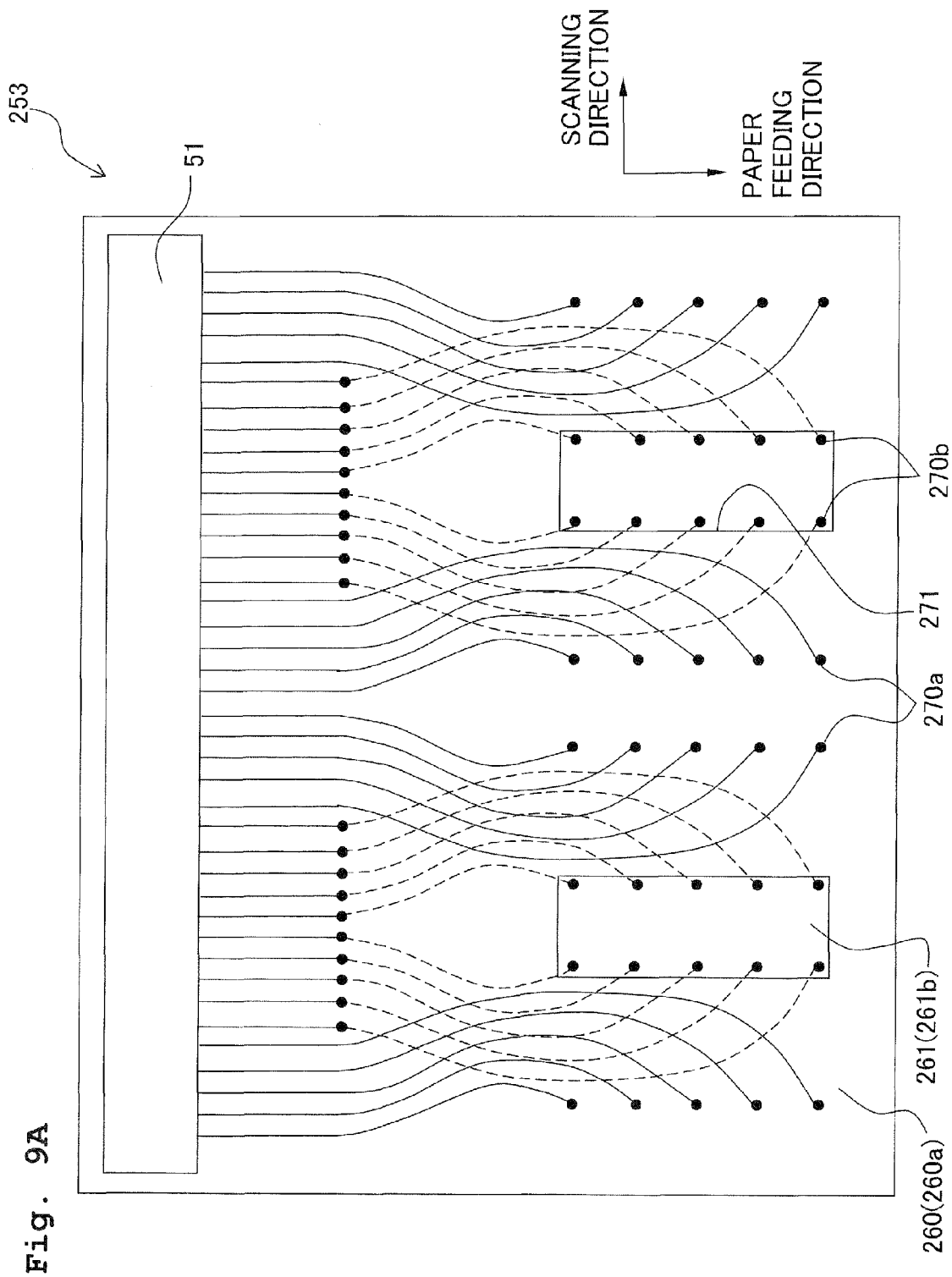
Figure 9C:
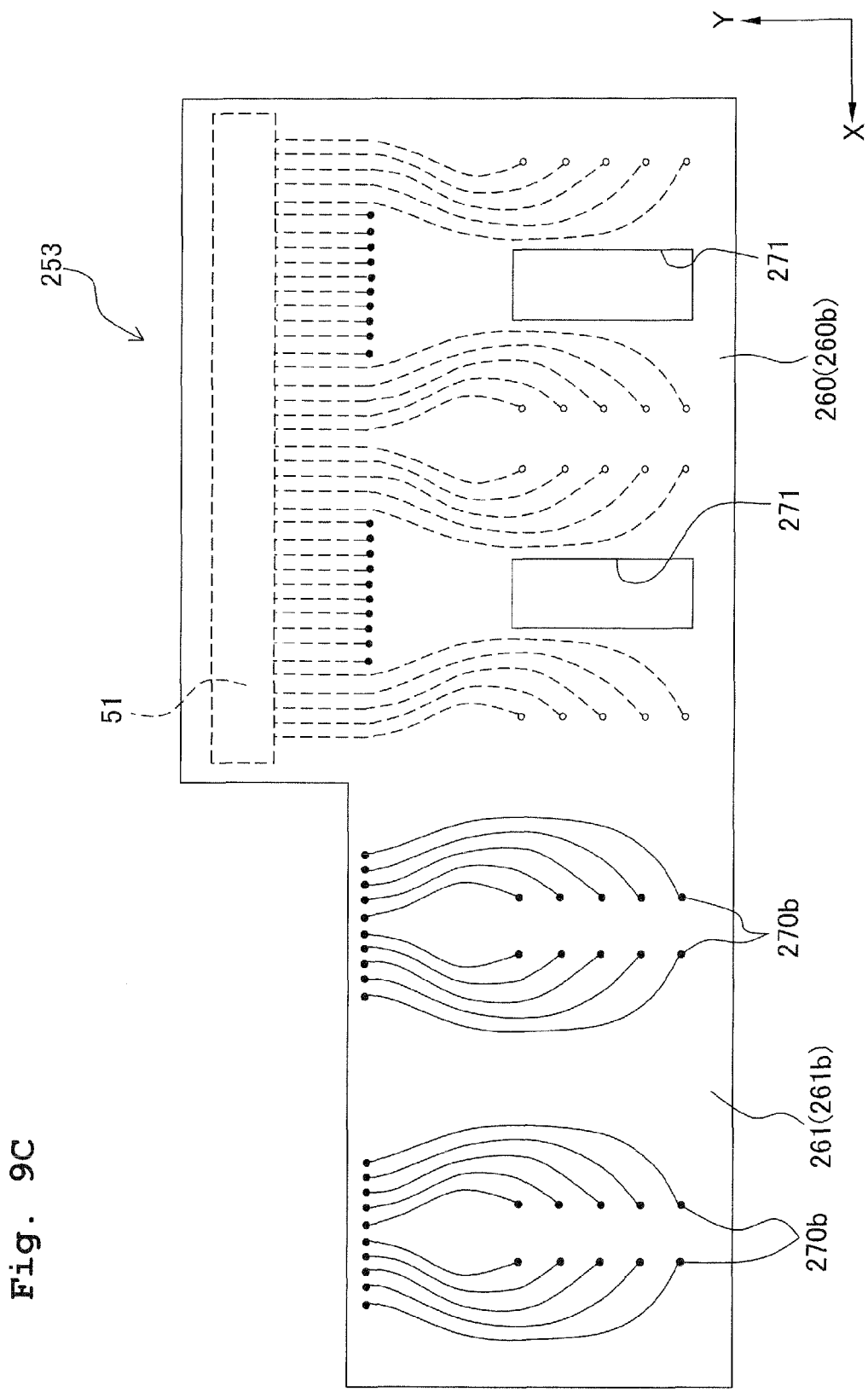

Moreover, in the embodiment, one row of the first substrate-side bumps 70a and the opening 71 which exposes one row of the second substrate-side bumps 70b have been arranged to be aligned alternately in the scanning direction as shown in FIG. 5. However, a substrate 253 may be structured as shown in FIG. 9A and FIG. 9B. Concretely, when the X-direction is let to be the scanning direction, two sets of two rows of first substrate-side bumps 170 aligned in the X-direction and an opening 271 sandwiched between the two rows may be arranged in the X-direction. In this case, two rows of second substrate-side bumps 270b formed on a front surface 261b of a second portion 261 may be exposed from one opening 271 (a second modified embodiment). A width in the scanning direction of the opening 271 is the minimum width which can expose the two rows of the second substrate-side bumps 270b which are adjacent in the scanning direction. In other words, the width in the scanning direction of the opening 271 is almost same as a width of end portions of two second substrate-side bumps 270b adjacent in the scanning direction exposed through the opening 271, which are farthest in the scanning direction. Drawing around of wires from the driver IC 51 to the first substrate-side bumps 270a and the second substrate-side bumps 270b is similar as in the abovementioned embodiment. Accordingly, an effect similar as in the abovementioned embodiment is shown. Moreover, as compared to the abovementioned embodiment, the number of openings for the total number of rows (in other words, eight rows) of the first substrate-side bumps 270a and the second substrate-side bumps 270b is reduced, and since each opening is large, it is easy to form the openings.

Figure 10A:
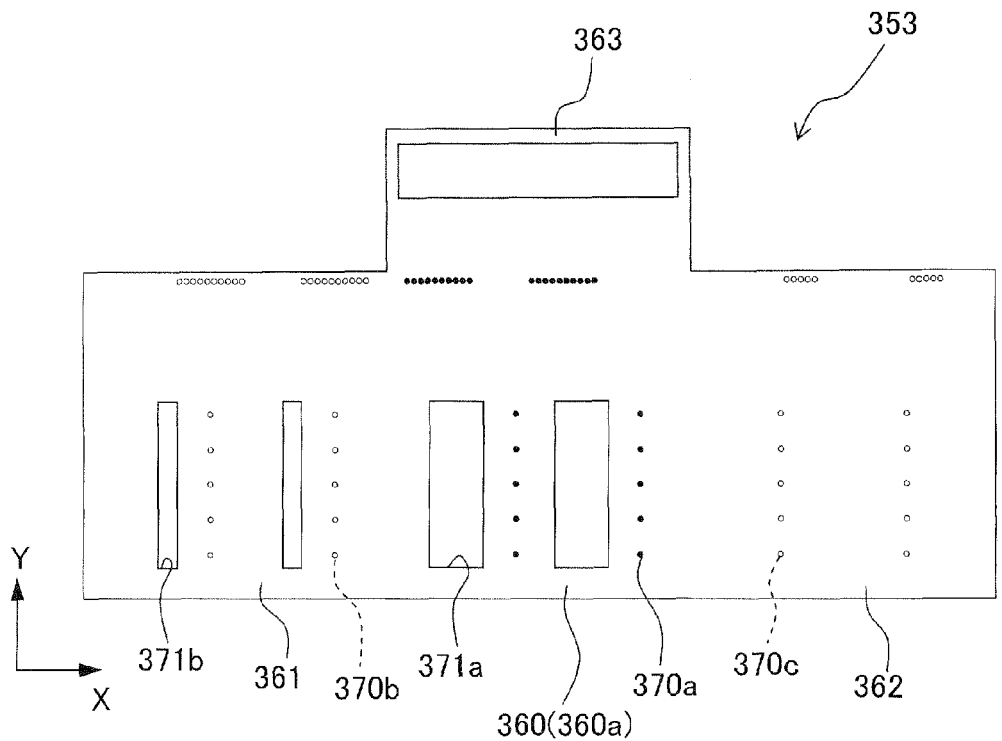
FIG. 10A and FIG. 10B are diagrams explaining a third modified embodiment, where.
Figure 10B:
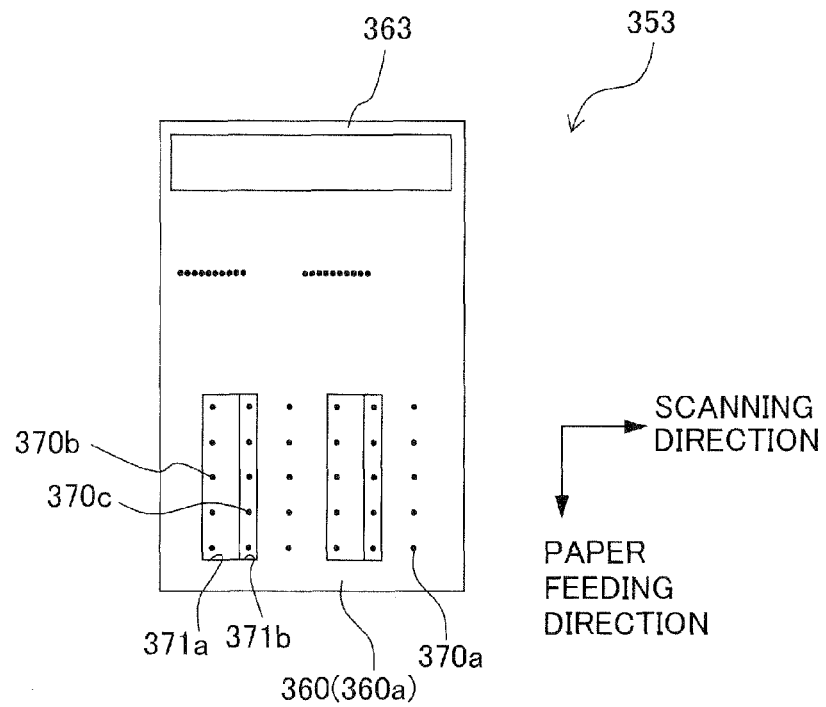

In the embodiment, a case in which the first portion 60 and the second portion 61 are overlapped in two layers in the direction of thickness, by bending the substrate 53 has been described. However, the number of layers which are overlapped by bending the substrate 53 may be more than two (a third modified embodiment). For example, as shown in FIG. 10A, a substrate 353 may include a first portion 360, a second portion 361 and a third portion 362 having a same shape as the first portion 360, which are in continuity with first portion 360, and arranged to be aligned with the first portion 360 in the X-direction, and a fourth portion 363 which is in continuity with the first portion 360, and which is arranged to be aligned in the Y-direction. Substrate-side bumps 370a, 370b, and 370c may be formed to be distributed on a rear surface 360a facing the actuator unit 31, of the first portion 360, a front surface of the second portion 361, and a front surface of the third portion 362. Moreover, an opening 371a, which exposes the substrate-side bumps 370b formed on the second portion 361 and the substrate-side bumps 370c formed on the third portion 363 when the substrate 353 is bent so that the first portion 360, the second portion 361, and the third portion 362 are overlapped, may be formed in the first portion 360. Furthermore, an opening 371b, which exposes the substrate-side bumps 370c formed on the third portion 362 when the substrate 53 is bent so that the first portion 360, the second portion 361, and the third portion 362 are overlapped with each other, may be formed in the second portion 361. In this case, a width of the opening 371a formed in the first portion 360 may be grater than a width of the opening 371b formed in the second portion 361 so that the opening 371a exposes the substrate-side bumps 370b and the substrate-side bumps 370c which are exposed from the opening 371b. Drawing of wires on the first portion 360 and the second portion 361 being similar as in the abovementioned embodiment, and drawing of the wires on the third portion 362 being similar as on the second portion 361, the description thereof is omitted. When the substrate 53 is bent so that the first portion 360, the second portion 361, and the third portion 362 are overlapped with each other, all the substrate-side bumps 370 are exposed from the rear surface 360a of the first portion 360 of the substrate 353, and are connected to the object-side bumps 43 of the actuator unit 31. Further, even if the opening 371a and the opening 371b are not formed in the substrate 353 of the third modified embodiment, it is possible to apply the wiring structure of the first modified embodiment to the substrate 353 in which the opening 371a and the opening 371b are not formed. Namely, all the substrate-side bumps 370 may be formed on the first portion 360 of the substrate 353 and the wires may be drawn from the driver IC to the substrate-side bumps 370 to be distributed around the first portion 360, the second portion 361 and the third portion 362. In this case, each of connecting bumps formed on a front surface 361b of the second portion 361 and connecting bumps formed on a front surface 362b of the third portion 362 may be connected to one of the substrate-side bumps 370 via the electroconductive material 176a filled in one of the through holes formed in the first portion 360.

In the abovementioned embodiment and the modified embodiments thereof, the third portion 62 on which the driver IC 51 is arranged has been in continuity with the first portion 60. However, the third portion 62 may be in continuity with the second portion 61, and not with the first portion 60. In this case, when the driver IC 51 is let to be arranged on a front surface 62b of the third portion 62, it is possible to connect the second substrate-side bumps 70b formed on the front surface 61b of the second portion 61 to the driver IC 51 by one wire corresponding to the first wire 72a, similarly as the first substrate-side bumps 70a in the abovementioned embodiment. This one wire corresponds to a third wire according to the present invention. Moreover, it is possible to connect the first substrate-side bumps 70a formed on the rear surface 60a of the first portion 60 to the driver IC 51 by using a wire corresponding to the second wire 75, and a structure corresponding to the second connecting bump 74, the first connecting bump 73, the electroconductive material 76a filled in the through hole 76, and the first wire 72b, similarly as the second substrate-side bumps 70b in the abovementioned embodiment. In this case, the first connecting bump 73 and the second connecting bump 74 correspond to a third connecting contact point and a fourth connecting contact point according to the present invention. Further, the second wire 75 corresponds to a fourth wire according to the present invention.

Moreover, as a structure connecting contact points on a wiring board side and contact points on an actuator-unit side, bumps have been used as contact points, and the description has been made by citing an example or a structure connecting the bumps. However, the structure may be such that, bumps are used for contact points on one side and lands are used for contact points on the other side, and the bumps and lands are to be connected.

Moreover, the substrate-side bumps 70 formed on the substrate 53 form rows by being arranged to be aligned in the Y-direction, and these rows are arranged to be aligned in the X-direction which is orthogonal to the Y-direction. The substrate-side bumps may be arranged randomly without any regularity of arrangement.

The opening 71 has been formed for each row of the second substrate-side bumps 70b. However, the opening 71 may be formed for each second substrate-side bump 70b.

Moreover, bumps formed at the end portion of the individual electrode 42 have been described as the object-side bumps 43. However, a common electrode may be drawn from the vibration plate 40 on the upper surface of the piezoelectric layer 41, and a bump formed on the common electrode may be let to be the object-side bump 43. The vibration plate 40, without restricting to a metallic material, may be a made of a material same as the material of the piezoelectric layer 41. In this case, the common electrode facing the plurality of individual electrodes 42 may be formed between the piezoelectric layer 41 and the vibration plate 40, and the common electrode may be drawn on the upper surface of the piezoelectric layer 41 as described above.

The driver IC 51 has been arranged, and a flexible substrate has been used as the substrate 53 to be connected to the actuator unit 31. However, the substrate may be a hard substrate instead of the flexible substrate, and only a boundary portion at a boundary of the first portion 60 and the second portion 61 which is to be bent may be let to be flexible.

The second portion 61 has been connected to the piezoelectric layer 41 by overlapping the second portion 61 on the first portion 60 by bending the substrate 53 after the first portion 60 of the substrate 53 has been positioned with respect to the piezoelectric layer 41 of the actuator unit 31. However, the second portion 61 may be connected to the piezoelectric layer 41 at the same time when the first portion 60 has been connected upon positioning with respect to the piezoelectric layer 41 of the actuator unit 31 after the first portion 60 and the second portion 61 are overlapped by bending the substrate 53.

Figure 11A:
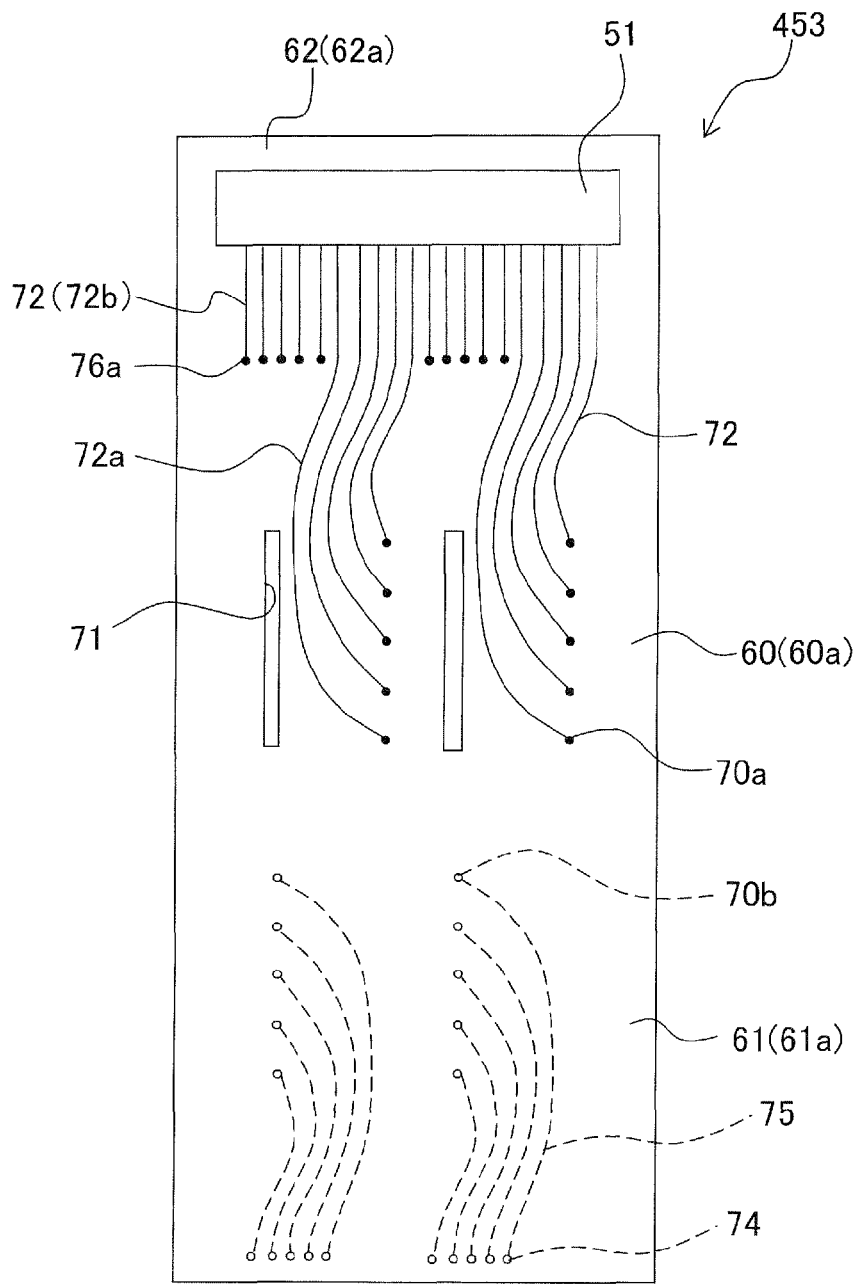
FIG. 11A and FIG. 11B are diagrams corresponding to FIG. 6A in other modified embodiment.
Figure 11B:
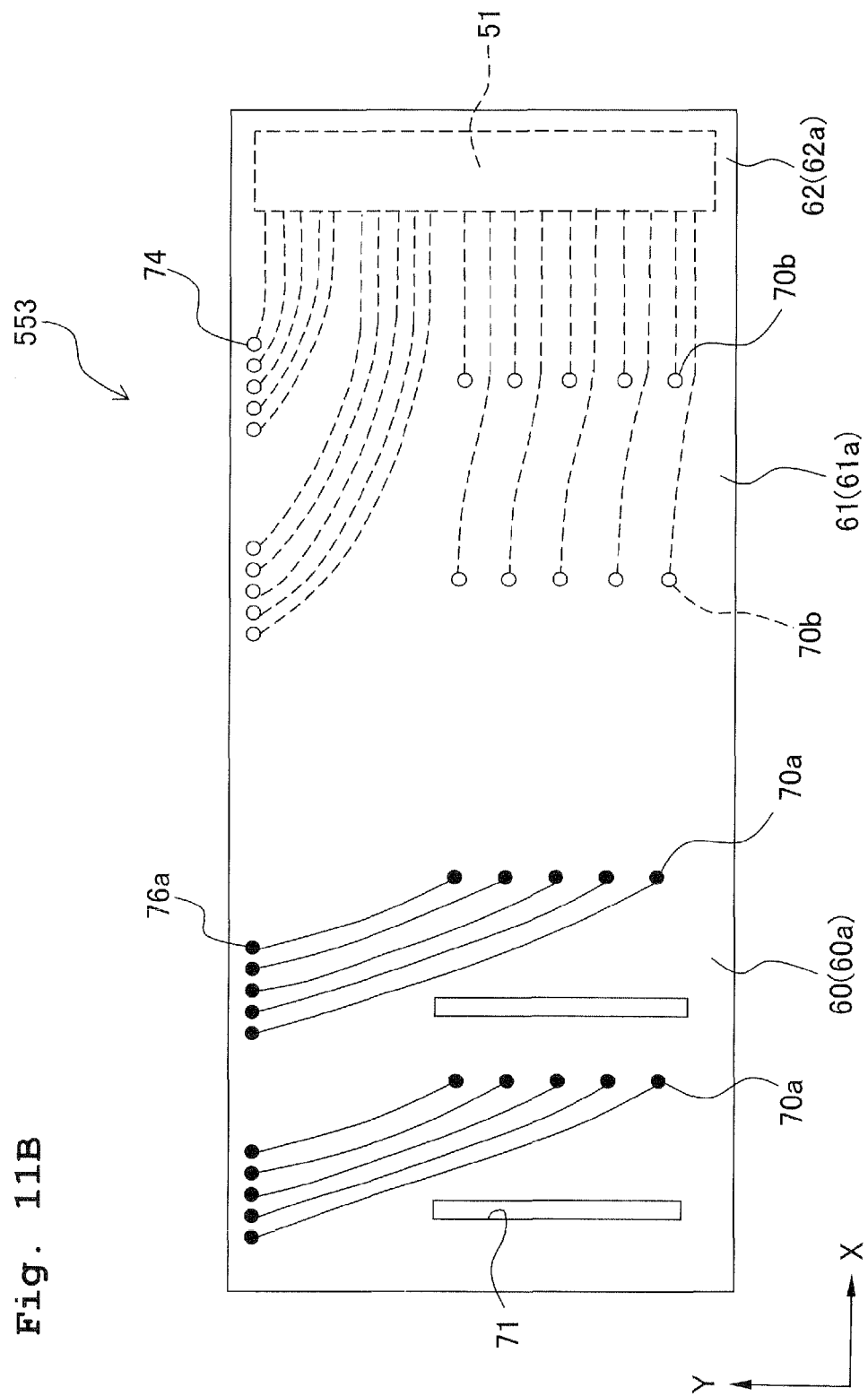

Moreover, the second portion 61 has been arranged side-by-side with the first portion 60 in the X-direction. However, the second portion 61 may be arranged side-by-side with the first portion 60 in the Y-direction as shown in FIG. 11A. The third portion 62 has been arranged side-by-side with the first portion 60 or the second portion 61 in the Y-direction. However, the third portion 62 may be arranged side-by-side with the first portion 60 or the second portion 61 in the X-direction as shown in FIG. 11B.

In the embodiment and the modified embodiments thereof described above, each of the openings has a rectangular shape and exposes a plurality of substrate-side bumps. However, the openings may be formed such that each of the openings exposes one of the plurality of substrate-side bumps.

The embodiment and the modified embodiments thereof described above are examples in which the present invention is applied to a wiring board for an actuator drive of the ink-jet head. However, the application of the present invention is not restricted only to such wiring board, and irrespective of the application, the present invention is applicable to a wiring board which carries out transceiving of various signals and supply of electric power.

What is claimed is:

1. A wiring board which is to be connected to a connecting portion of an object, comprising:
    a plurality of contact points which are to be connected to the connecting portion of the object;
    a plurality of wires which are connected to the contact points; and
    a substrate on which the contact points and the wires are formed, and which has a first portion which has an opening and overlaps with the connecting portion of the object when the wiring board is connected to the object, and a second portion which is continuous to the first portion,
    wherein the contact points include first contact points which are formed in the first portion on one surface of the substrate facing the object, and second contact points which are formed in the second portion on the other surface of the substrate, and
    the second contact points are exposed to the one surface of the substrate through the opening formed in the first portion when the substrate is bent so that the first portion is overlapped with the second portion.

2. The wiring board according to claim 1, wherein a driver IC to which the plurality of contact points are connected via the plurality of wires is arranged on the substrate in an area at which the first portion and the second portion do not overlap with each other when the substrate is bent.

3. The wiring board according to claim 1,
    wherein the first contact points and the second contact points form a plurality of rows each of which extends in a predetermined first direction and which are arranged in a second direction intersecting with the first direction when the substrate is bent so that the first portion and the second portion are overlapped with each other and the plurality of wires which are connected to the plurality of contact points are drawn in the first direction.

4. The wiring board according to claim 1, wherein a boundary portion of the first portion and the second portion on the substrate is flexible.

5. The wiring board according to claim 1,
    further comprising a third portion which is continuous to the first portion and extends on an opposite side of the second portion with respect to the first portion,
    wherein the contact points further include third contact points which are fowled in the third portion, on the other surface of the substrate, and a second opening is formed in the second portion, at position facing the third contact points when the substrate is bent so that the second portion and the third portion are overlapped with each other.

6. A liquid jetting head which jets a liquid, comprising:
    a channel unit in which channels of the liquid are formed;
    a pressure applying mechanism which applies a jetting pressure to the liquid inside the channels, and
    a wiring board as defined in claim 1 which is connected to the pressure applying mechanism.

7. The wiring board according to claim 2,
    wherein the driver IC is arranged on the first portion of the substrate,
    a plurality of first wires which are connected to the driver IC are formed in the first portion,
    some of the first wires are connected to the first contact points,
    first connecting contact points which are connected to the other of the first wires are formed in the first portion on the other surface of the substrate, and
    second connecting contact points which are to be connected to the first connecting contact points respectively when the substrate is bent so that the second portion is overlapped on the first portion, and second wires which connect the second connecting contact points and the second contact points respectively are formed in the second portion on the other surface of the substrate.

8. The wiring board according to claim 2,
    wherein the driver IC is arranged on the second portion of the substrate,
    a plurality of third wires which are connected to the driver IC are formed in the second portion,
    some of the third wires are connected to the second contact points, third connecting contact points which are connected to the other of the third wires are formed in the second portion on the other surface of the substrate, and fourth connecting contact points which are to be connected to the third connecting contact points respectively when the substrate is bent so that the first portion is overlapped on the second portion, and fourth wires which connect the fourth connecting contact points and the first contact points respectively are formed in the first portion on the other surface of the substrate.

9. The wiring board according to claim 3,
wherein a row of the first contact points and the opening are arranged in the second direction in the first portion, and a width of the opening in the second direction is almost same as a width of each of the second contact points in the second direction.

10. The wiring board according to claim 3,
wherein a row of the first contact points and the opening which exposes two rows of the second contact points to the one surface of the substrate, are arranged in the second direction in the first portion, and a width of the opening in the second direction is almost same as a distance of farthest end portions of the two adjacent second contact portions in the second direction.

11. The wiring board according to claim 5, wherein the third contact points are exposed to the one surface of the substrate through the opening formed in the first portion and the second opening formed in the second portion, when the substrate is bent so that the first portion, the second portion, and the third portion are overlapped with each other.

12. The wiring board according to claim 11, wherein each of the opening formed in the first portion and the second opening formed in the second portion has a rectangular shape which is long in a predetermined direction, and a width in a short direction of the opening is greater than a width in a short direction of the second opening.

13. A wiring board which is to be connected to a connecting portion of an object, comprising:
  a plurality of contact points which are to be connected to the connecting portion of the object;
  a plurality of wires which are connected to the contact points; and
  a substrate on which the contact points and the wires are formed, and which has a first portion which overlaps with the connecting portion of the object when the wiring board is connected to the object and a second portion which is continuous to the first portion,
  wherein the contact points are formed in the first portion on one surface of the substrate facing the object,
  fifth connecting contact points, each of which overlaps with one contact point of the contact points and is connected to the one contact point via an electroconductive material penetrating the substrate, are formed on the other surface of the substrate, and
  sixth connecting contact points are formed in the second portion on the other surface of the substrate so that the sixth connecting contact points are connected to the fifth connecting contact points respectively when the substrate is bent so that the first portion is overlapped with the second portion.

* * * * *